United States Patent
Dally

(10) Patent No.: US 10,026,468 B2
(45) Date of Patent: Jul. 17, 2018

(54) DRAM WITH SEGMENTED WORD LINE SWITCHING CIRCUIT FOR CAUSING SELECTION OF PORTION OF ROWS AND CIRCUITRY FOR A VARIABLE PAGE WIDTH CONTROL SCHEME

(71) Applicant: NVIDIA Corporation, Santa Clara, CA (US)

(72) Inventor: William James Dally, Los Altos Hills, CA (US)

(73) Assignee: NVIDIA CORPORATION, Santa Clara, CA (US)

(*) Notice: Subject to any disclaimer, the term of this patent is extended or adjusted under 35 U.S.C. 154(b) by 9 days.

(21) Appl. No.: 15/430,393

(22) Filed: Feb. 10, 2017

(65) Prior Publication Data

US 2017/0154667 A1    Jun. 1, 2017

Related U.S. Application Data

(63) Continuation of application No. 13/761,996, filed on Feb. 7, 2013, now abandoned.

(51) Int. Cl.
  *G11C 11/4091* (2006.01)
  *G11C 11/408* (2006.01)
  *G11C 11/4099* (2006.01)

(52) U.S. Cl.
  CPC ...... *G11C 11/4091* (2013.01); *G11C 11/4085* (2013.01); *G11C 11/4087* (2013.01); *G11C 11/4099* (2013.01)

(58) Field of Classification Search
  CPC .................................................. G11C 11/4091
  See application file for complete search history.

(56) References Cited

U.S. PATENT DOCUMENTS

| 4,969,125 A | * | 11/1990 | Ciraula | G11C 5/005 365/203 |
| 5,241,503 A | * | 8/1993 | Cheng | G11C 11/4091 365/149 |
| 5,862,098 A | * | 1/1999 | Jeong | G11C 8/10 365/230.03 |

(Continued)

FOREIGN PATENT DOCUMENTS

| CN | 1220466 A | 6/1999 |
| CN | 101169967 A | 4/2008 |
| DE | 102006014048 A1 | 12/2006 |

OTHER PUBLICATIONS

Office Action from Taiwan Application No. 102141086, dated Jun. 2, 2015.

(Continued)

*Primary Examiner* — Anthan Tran
*Assistant Examiner* — Mushfique Siddique
(74) *Attorney, Agent, or Firm* — Zilka-Kotab, P.C.

(57) ABSTRACT

This description is directed to a dynamic random access memory (DRAM) array having a plurality of rows and a plurality of columns. The array further includes a plurality of cells, each of which are associated with one of the columns and one of the rows. Each cell includes a capacitor that is selectively coupled to a bit line of its associate column so as to share charge with the bit line when the cell is selected. There is a segmented word line circuit for each row, which is controllable to cause selection of only a portion of the cells in the row.

20 Claims, 2 Drawing Sheets

(56) References Cited

U.S. PATENT DOCUMENTS

| | | | |
|---|---|---|---|
| 6,252,794 B1 | 6/2001 | Sunaga et al. | |
| 6,256,254 B1* | 7/2001 | Kwak | G11C 8/10 365/230.03 |
| 6,314,042 B1* | 11/2001 | Tomishima | G11C 7/1006 365/230.03 |
| 6,314,048 B1* | 11/2001 | Ishikawa | G11C 8/00 365/190 |
| 6,335,896 B1 | 1/2002 | Wahlstrom | |
| 6,510,093 B1* | 1/2003 | Dhong | G11C 7/12 365/189.15 |
| 6,765,845 B2* | 7/2004 | Choi | G11C 8/12 365/227 |
| 6,898,137 B2* | 5/2005 | Arimoto | G11C 7/062 365/149 |
| 7,002,825 B2* | 2/2006 | Scheuerlein | G11C 8/08 257/E27.103 |
| 7,170,808 B2 | 1/2007 | Hokenmaier | |
| 8,068,365 B2* | 11/2011 | Kim | G11C 8/08 365/185.12 |
| 8,964,449 B2* | 2/2015 | Yun | G11C 11/4076 365/149 |
| 2003/0151966 A1* | 8/2003 | Demone | G11C 7/1039 365/222 |
| 2006/0215474 A1 | 9/2006 | Hokenmaier | |
| 2007/0139995 A1* | 6/2007 | Sekiguchi | G11C 7/12 365/149 |
| 2009/0034347 A1* | 2/2009 | Demone | G11C 7/1039 365/189.15 |
| 2009/0157983 A1* | 6/2009 | Bowyer | G06F 12/0215 711/154 |
| 2009/0257272 A1 | 10/2009 | Stembridge et al. | |
| 2011/0110175 A1 | 5/2011 | Chang et al. | |
| 2012/0008426 A1* | 1/2012 | Demone | G11C 7/1039 365/189.05 |
| 2012/0287699 A1* | 11/2012 | Yun | G11C 11/4076 365/149 |
| 2012/0317352 A1* | 12/2012 | Kang | G11C 11/40611 711/106 |
| 2014/0219007 A1* | 8/2014 | Dally | G11C 11/4063 365/149 |
| 2017/0154667 A1* | 6/2017 | Dally | G11C 11/4091 |

OTHER PUBLICATIONS

Office Action from German Patent Application No. 10 2013 114 251.6, dated Dec. 10, 2015.

Office Action from Chinese Application No. 201310753153.9, dated May 19, 2016.

* cited by examiner

DRAM WITH SEGMENTED WORD LINE SWITCHING CIRCUIT FOR CAUSING SELECTION OF PORTION OF ROWS AND CIRCUITRY FOR A VARIABLE PAGE WIDTH CONTROL SCHEME

CLAIM OF PRIORITY

This application is a continuation of U.S. application Ser. No. 13/761,996 titled "DRAM With Segmented Page Configuration," filed Feb. 7, 2013, the entire contents of which is incorporated herein by reference.

BACKGROUND

Conventional dynamic random access memory (DRAM) arrays have a large page size—the number of bits that are read into sense amplifiers during row activate operations. The large page size, typically 8,192 bits, is beneficial in that it allows the entire array to be refreshed with fewer operations. On the other hand the large page size can result in considerable wasted energy. One example of unnecessary energy expenditure is a read operation in which, as typically is the case, only a small number (4-32) of the bits in the page are of interest. Despite this, all of the bit lines in the page are charged and discharged to perform such a read in conventional DRAMs. So energy is expended to read the entire page when data from only a portion of the page is needed.

SUMMARY

A DRAM array is organized as a matrix of cells in rows and columns, such that each cell is uniquely associated with a specific row and column. The DRAM array has a width, also referred to as the page width, which is equal to the number of columns in the array. The DRAM array includes multiple subpages and each subpage includes a subset of the columns of the array. The DRAM array is configured so that certain operations can be implemented so as to affect only the columns within one or more of the subpages, or only a portion of the width of the array. For example, the rows of the array may have segmented word lines, so that each row has multiple local word lines. Each of the local word lines is associated with one of the subpages. Instead of activating the entire row and thereby expending energy to read and restore bits that may not be of interest one or more selected local word lines may be used to select and read only those cells associated with the local word lines. The columns associated with the non-selected local word lines are not used, providing an energy savings over what would be expended if all of the columns were used.

DETAILED DESCRIPTION

This description is directed to a dynamic random access memory (DRAM) array which can be operated in a more energy efficient manner. The DRAM array is organized as a matrix of cells in rows and columns, such that each cell is uniquely associated with a specific row and column. The DRAM array has a width, also referred to as the page width, which is equal to the number of columns in the array. The DRAM array is configured so that certain operations can be implemented so as to affect only some of the columns, or only a portion of the width of the array. For example, the rows of the array may have segmented word lines, so that each row has multiple local word lines. Instead of activating the entire row and thereby expending energy to read and restore bits that may not be of interest (i.e., wasted energy due to "overfetch,") one or more selected local word lines may be used to select and read only those cells associated with the local word lines. The columns associated with the non-selected local word lines are not used, providing an energy savings over what would be expended if all of the columns were used. Specifically, the bit lines of those non-selected columns do not need to be charged and discharged to perform the targeted read. Nor do the cells and dummy cells for those columns need to be restored.

Figure 1:
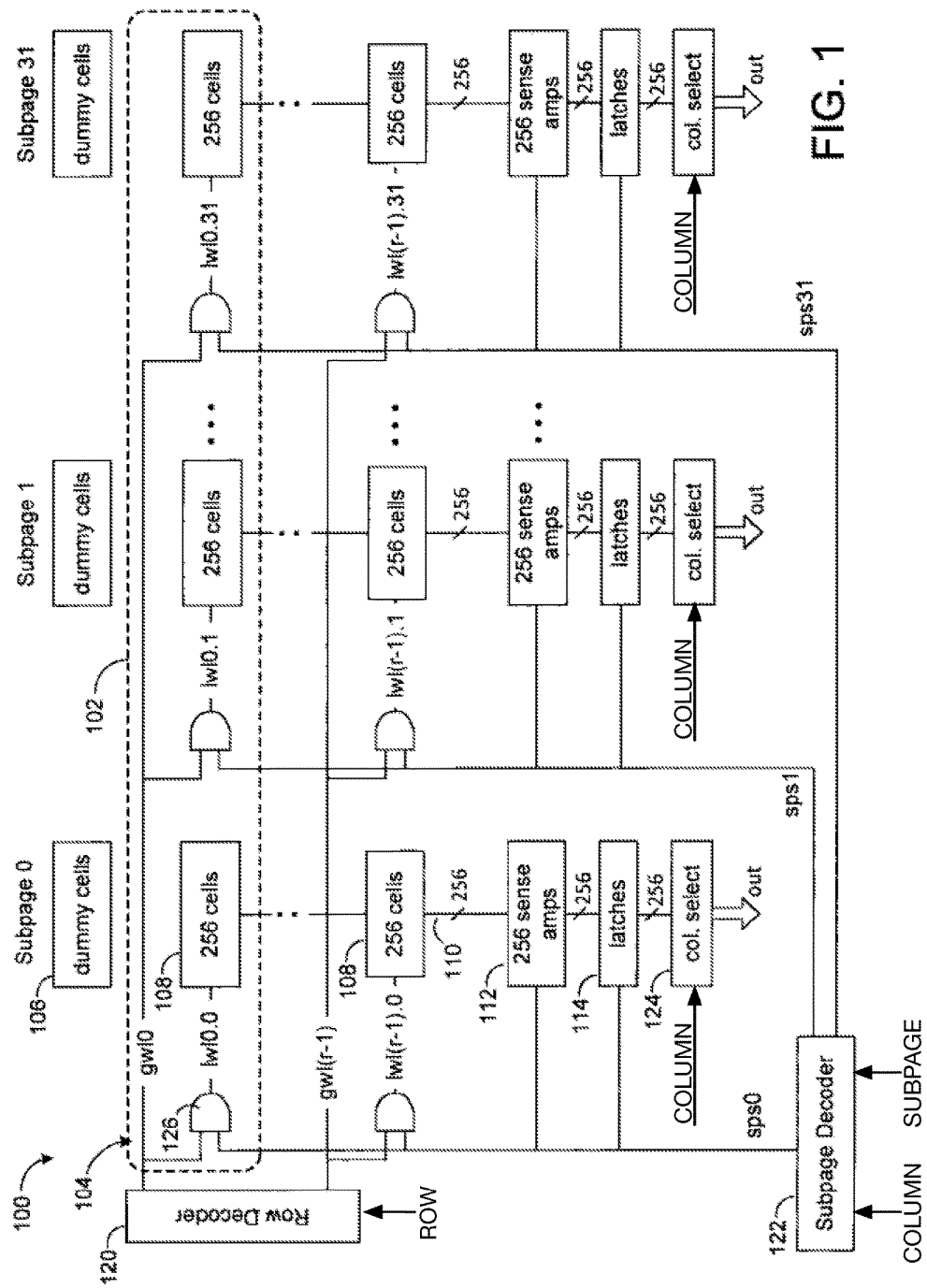
FIG. 1 schematically shows an exemplary dynamic random access memory (DRAM) array according to the present description, having a segmented page configuration.

FIG. 1 shows an exemplary DRAM array 100 according to the present description. DRAM array 100 includes storage cells arranged in a matrix of rows and columns, such that each storage cell is uniquely associated with a specific row and column. In the example of FIG. 1, the array has r rows, one of which is indicated at 102 in the figure, and 8192 columns (eight kilobit page size). The 8192 columns are grouped into 32 groups or "subpages" of 256 columns each. The vertical stack of elements headed by each box labeled "dummy cells" corresponds to one of the 32 groups of 256 columns. Therefore, each column has r cells (the number of rows in the array) and each row has 8192 cells (the number of columns in the array). Where dummy cells are employed, each column will also have two dummy cells, one even and one odd. The specific numbers of rows, columns, cells and columns per group are arbitrary in the example; other numbers may be employed as appropriate to the implementation.

Figure 2:
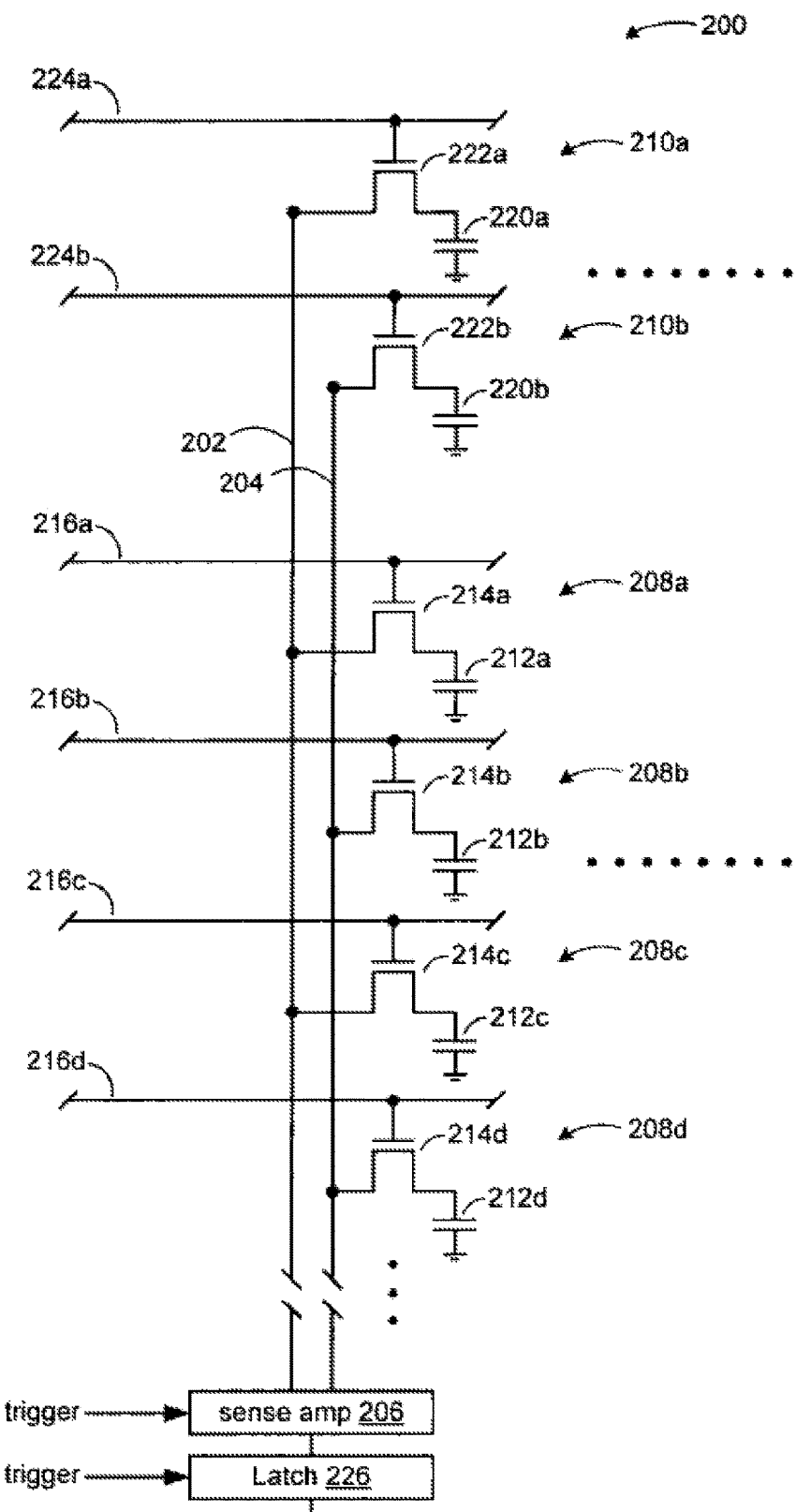
FIG. 2 schematically depicts a column and associated structures of the DRAM array of FIG. 1.

FIG. 2 schematically shows an example column 200 of DRAM array 100. Column 200 includes a pair of bit lines—even bit line 202 and odd bit line 204—that are coupled to sense amplifier 206. The figure shows six cells: four regular storage cells 208 and two dummy cells 210. Each cell 208 has a capacitor 212 coupled to one of the bit lines via a transistor 214 that is gate-coupled to a word line 216 that is asserted to turn on the transistor. Cells 208a and 208c are coupled to even bit line 202, and cells 208b and 208d are coupled to odd bit line 204. Cells 208a and 208c may therefore be referred to as "even cells," and cells 208b and 208d as "odd cells." Their associated word lines may be designated similarly, i.e., 216a and 216c are even word lines and 216b and 216d are odd word lines.

Dummy cells 210 include similar configurations of capacitors 220, transistors 222 and word lines 224. Dummy cell 210a is coupled to even bit line 202, and it and its dummy word line 224a may therefore be referred to as "even." Dummy cell 210b and dummy word line 224b in turn are "odd."

Prior to reading the logical HI or logical LO values stored in the cells, bit lines 202 and 204, and dummy cells 210, are precharged to 50% of the logical HI voltage. For simplicity, logical HI and logical LO will be referred to herein as Vdd and Vss, respectively. A row is then activated by asserting one of the word lines 216 so as to turn on the transistor and cause the logical HI or LO voltage stored on the cell capacitor to be shared with the pre-charged bit line. Typically the capacitance of the bit line is relatively high compared to the capacitance of the cell. Accordingly, if the stored value is HI, the resulting voltage on the bit line after charge sharing will he slightly higher than the precharged 50% value (Vdd/2 plus a small amount). If the stored value is LO (Vss), then the resulting voltage after charge sharing will be slightly less than the 50% value (Vdd/2 minus a small amount).

At the same time that the specific word line 216 is asserted, a complementary dummy word line 224 is asserted. In other words, if an even row is activated (line 216a or 216c), then the odd dummy line 224b is asserted to cause the odd dummy cell to share charge onto the precharged odd bit line 204, and vice versa.

At this point, one of the bit lines is slightly above or below Vdd/2, respectively reflecting whether the stored value in the cell was HI or LO, and the other is at Vdd/2 due to precharge and the Vdd/2 value on the dummy cell capacitor. There may be some movement due to noise and other factors, but the use of the dummy cell facilitates producing an accurately measurable differential signal on the bit lines in the face of noise and other issues. The sense amplifier is then triggered to capture the differential signal and convert the small differential into a logical HI or LO output, depending on the value that was on the storage cell capacitor. The column may also optionally include a latch 226 to provide an additional bit of storage. For example a value may be held active in the latch while refresh or precharge operations are being performed that affect the sense amplifier. In addition to capturing the differential signal, the sense amplifier also drives the bit line full swing to restore the capacitor to its charge level existing just prior to the destructive read. Once the charge is restored across the cell capacitor, the cell's word line is lowered.

Returning now to FIG. 1, DRAM array 100 is configured so that certain DRAM commands affect only a selected portion of the width of the array. In terms of the array's columns, control may be implemented to control which columns of the DRAM array are involved during word line assertions, bit line precharge, sense amp operation, latch control, column selection and other commanded DRAM operations. In terms of a given row, this control may be understood as creating a condition in which a DRAM command affects only a portion of the row.

DRAM array 100 includes 32 subpages, designated "Subpage 0" through "Subpage 31" at the top of the figure. Each subpage includes a group of 256 columns. Each column is as described with reference to FIG. 2—i.e., each column has dummy cells 106 and regular storage cells 108 coupled to bit line pairs 110 that are connected to sense amplifiers 112. As indicated, one or more latches 114 may also be included in each column to store the sense amplifier output and thereby provide one or more additional bits of storage. To simplify the figure, reference numbers are designated only on the first subpage and only a single latch per column is shown.

At the row level, the subpage configuration is implemented with segmented word lines. Specifically, each row has a segmented word line circuit including a global word line and a plurality of local word lines. Each local word line is associated with one of the subpages of the array. Referring specifically to row 102, segmented word line circuit 104 includes a global word line (gwl0) and 32 local word lines lwl0.0 through lwl0.31. Among other things, as will be described below, the segmented word line circuits are controllable to cause selection of only a portion of the cells in an active row of the array (e.g., turn on cell transistors only in a selected subpage or subpages.)

Decode and select functions are performed by one or more decoders that select rows, subpages and columns for various operations. In the present example, DRAM array 100 includes a row decoder 120, subpage decoder 122 and column selectors 124. DRAM array 100 is thus addressed with row, subpage and column fields. Typically, only one row is selected at a time, so in the case of an array with 256 rows, the row field would be eight bits wide. If only one subpage is selected at a time, the 32 subpages would be addressed with a 5-bit field, though implementations are possible in which more than one subpage is selected at a time. Still further, it will at times be desirable to have all of the subpages of the array selected. The 256 individual columns within a subpage may be addressed with an 8-bit field in order to select a single column. Additional command bandwidth may be provided for multi-I/O configurations in which multiple columns are selected.

A row activate operation will now be described, in which cell charges are read onto bit lines, bit line values are sensed, and cells are restored to the charge values present before the destructive read of the charge on the cell capacitors. To activate a subpage of a row, row decoder 120 decodes a row address ROW in order to select a single global word line gwl(ROW) to go high. In parallel, subpage decoder 122 decodes a subpage address SUBPAGE to generate a subpage select signal that drives a single subpage select line sps (SUBPAGE) to go high. These two asserted signals are ANDed (e.g., with AND gate 126) such that their coincidence causes a single local word line lwl(ROW.SUBPAGE) to go high, as a result of the subpage select signal gating the global word line. This selects the 256 cells (switches on their transistors) on that row and in that subpage so that the cell capacitors are connected to and share their charge with their precharged bit lines. The sps(SUBPAGE) assertion also triggers the associated subpage of sense amplifiers to sense and capture the signal on the bit lines and restore it to full swing. Once the restored charge is written back to the selected cells, the word line can be lowered.

The column groupings and subpage decoding in FIG. 1 are arbitrary and provided as an illustrative example; different configurations may be employed without departing from the spirit of this description. Subpages can have any practicable number of columns. Additional decode command bandwidth can be provided to select multiple subpages, instead of one at a time. For example, a power-of-2 scheme could be employed allowing for selection of 2, 4, 8 or 16 of the 32 subpages, In such a case, the array provides variable page width operation, in which the decoder output determines the size of the portion of the row being activated—a first control can cause a first set of subpages to be activated, with a second control activating a larger set of subpages. In the most general case, subpage decoding can be implemented as a mask (32 bits in the current example) in which any combination and number of subpages can be selected.

The subpage implementation can also allow for targeted precharge operations, which can produce significant energy savings. As discussed above, the row activate operation ends with values being restored across the cell capacitors. Therefore, the precharge operation needs only to precharge the sense amplifiers and set the dummy cells and bit lines to their 50% values. The subpage select signals can again be employed so that the precharge operation only affects the selected columns and their associated bit lines, cells, etc. Assuming a read operation on only one subpage, a subsequent precharge can be limited to that portion of the array, thereby avoiding expending energy to precharge the columns in non-selected subpages. These savings can be significant given that activate and precharge operations can occur at much higher frequencies than refresh.

It will be desirable at times to have all subpages selected at the same time, for example during a refresh operation. In the example of FIG. 1, signaling is provided to activate a global word line and cause all of the subpage select lines to go high. This connects all of the cells in the the row and the appropriate dummy cells to their respective sense amplifiers, which are also triggered by the subpage select lines. As described above, this causes the appropriate charge to be restored to the cell, after which the word line is lowered. If an extra latch is provided for each column, as in FIG. 1, a refresh can be performed without enabling the latch, allowing the pages to be held active during a refresh. Alternatively a special refresh—effectively a global row activate—can perform a refresh and enable the latch allowing all of the subpages of a page to be activated in a single operation.

A column address COLUMN is used in read and write operations. FIG. 1 shows column selectors 124 with which such an address may be used. In single-bit I/O operations (i.e., reading or writing a single column), COLUMN would be an 8-bit field which, when combined with the subpage address SUBPAGE, would specify a particular individual column within a designated subpage. Once a subpage has been loaded into the sense amplifiers (or the latches if present), the combination of the subpage and column address causes a specific column to be read out onto the data bus. These addresses are also used during write operations, to cause data to be loaded from the data bus into specific sense amplifiers or latches.

When multi-bit I/O is employed (i.e., reading/writing multiple cells simultaneously), it typically will be desirable to limit the activity to as few subpages as possible, to take advantage of the energy-saving features of the described segmentation. For example, if a 32-bit read is performed, taking one bit from each sub-page would entail reading 8 k bits into the sense amplifiers. Alternately, the 32 bits could all be read from a single subpage, thereby avoiding the overfetch energy expenditure needed to read from the other 31 subpages.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples as understood by those of ordinary skill in the art. Such other examples are intended to be within the scope of the claims.

What is claimed is:

1. A dynamic random access memory (DRAM) array, comprising:
   a plurality of cells arranged in a plurality of rows and a plurality of columns, each cell in the plurality of cells being associated with one column in the plurality of columns and one row in the plurality of rows;
   a plurality of sense amplifiers, each sense amplifier in the plurality of sense amplifiers being associated with one column in the plurality of columns and coupled to a pair of bit lines within the one column;
   a row decoder, coupled to a plurality of global word lines, wherein each global word line in the plurality of global word lines is associated with a corresponding row of the plurality of rows;
   a subpage decoder, coupled to a plurality of subpage select lines, wherein each subpage select line in the plurality of subpage select lines is associated with a corresponding first set of columns of the plurality of columns and with a corresponding set of sense amplifiers of the plurality of sense amplifiers, and a first subset of sense amplifiers of the plurality of sense amplifiers is coupled to a first subpage select line and a second subset of sense amplifiers of the plurality of sense amplifiers is coupled to a second subpage select line; and
   a first subpage comprising a first set of cells from the plurality of cells, such that within the first set of cells, one cell in each column within the first set of columns is coupled to a first local word line, wherein the first local word line is asserted when a first global word line is asserted and the first subpage select line is asserted.

2. The DRAM array of claim 1, wherein a first subset of cells that are within the first set of cells and associated with a first column within the first set of columns are coupled to a first bit line of the pair of bit lines within the first column and a second subset of the cells that are within the first set of cells and associated with the first column are coupled to a second bit line of the pair of bit lines within the first column.

3. The DRAM array of claim 2, further comprising, a first dummy cell that is coupled to the first bit line of the pair of bit lines within the first column and a second dummy cell that is coupled to the second bit line of the pair of bit lines within the first column.

4. The DRAM array of claim 3, wherein the first dummy cell is enabled only when one of the cells in the second subset of cells is enabled and the second dummy cell is enabled only when one of the cells in the first subset of cells is enabled.

5. The DRAM array of claim 3, wherein a first sense amplifier coupled to the first bit line and the second bit line is configured to read a cell coupled to the first bit line by amplifying a differential voltage between the first bit line and the second bit line, and the second dummy cell couples charge to the second bit line.

6. The DRAM array of claim 1, wherein a set of the pairs of bit lines that are within the first set of columns are precharged in response to the first subpage select line being asserted.

7. The DRAM array of claim 1, wherein the first subset of sense amplifiers are enabled to sense charge levels on a set of the pairs of bit lines that are within the first set of columns in response to the first subpage select line being asserted.

8. The DRAM array of claim 1, wherein the subpage decoder is configured to provide a variable page width operation such that, for a given one of the rows, the subpage decoder is operable to activate a portion of the row, which varies in size based on an output of the subpage decoder.

9. The DRAM array of claim 1, wherein the first local word line is asserted by a logic gate coupled between the first global word line and the first subpage select line.

10. The DRAM array of claim 1, wherein the first subset of sense amplifiers is enabled when the first subpage select line is asserted.

11. The DRAM array of claim 1, further comprising a second subpage comprising a second set of cells from the plurality of cells, such that within the second set of cells, one cell in each column within a second set of columns of the plurality of columns is coupled to a second local word line, wherein the second local word line is asserted when the first global word line is asserted and the second subpage select line is asserted.

12. A dynamic random access memory (DRAM) array, comprising:
   a plurality of cells arranged in a plurality of rows and a plurality of columns, each cell in the plurality of cells being associated with one column in the plurality of columns and one row in the plurality of rows;

a plurality of sense amplifiers, each sense amplifier in the plurality of sense amplifiers being associated with one column in the plurality of columns and coupled to a pair of bit lines within the one column;

a row decoder, coupled to a plurality of global word lines, wherein each global word line in the plurality of global word lines is associated with a corresponding row of the plurality of rows, wherein each one of the plurality of global word lines is associated with a different input row address, and the row decoder is configured to assert the first global word line of the plurality of global word lines based on the input row address and drive each of the remaining global word lines of the plurality of global word lines to a low logic voltage level;

a subpage decoder, coupled to a plurality of subpage select lines, wherein each subpage select line in the plurality of subpage select lines is associated with a corresponding first set of columns of the plurality of columns and with a corresponding set of sense amplifiers of the plurality of sense amplifiers; and a first subpage comprising a first set of cells from the plurality of cells, such that within the first set of cells, one cell in each column within the first set of columns is coupled to a first local word line, wherein the first local word line is asserted when a first global word line is asserted and a first subpage select line is asserted.

13. The DRAM array of claim 12, wherein a first subset of cells that are within the first set of cells and associated with a first column within the first set of columns are coupled to a first bit line of the pair of bit lines within the first column and a second subset of the cells that are within the first set of cells and associated with the first column are coupled to a second bit line of the pair of bit lines within the first column.

14. The DRAM array of claim 12, wherein the subpage decoder is configured to provide a variable page width operation such that, for a given one of the rows, the subpage decoder is operable to activate a portion of the row, which varies in size based on an output of the subpage decoder.

15. A dynamic random access memory (DRAM) array, comprising:

a plurality of cells arranged in a plurality of rows and a plurality of columns, each cell in the plurality of cells being associated with one column in the plurality of columns and one row in the plurality of rows;

a plurality of sense amplifiers, each sense amplifier in the plurality of sense amplifiers being associated with one column in the plurality of columns and coupled to a pair of bit lines within the one column;

a row decoder, coupled to a plurality of global word lines, wherein each global word line in the plurality of global word lines is associated with a corresponding row of the plurality of rows;

a subpage decoder, coupled to a plurality of subpage select lines, wherein each subpage select line in the plurality of subpage select lines is associated with a corresponding first set of columns of the plurality of columns and with a corresponding set of sense amplifiers of the plurality of sense amplifiers, and the subpage decoder is configured to assert the first subpage select line of the plurality of subpage select lines, based on an input column address and drive each of the remaining subpage select lines of the plurality of subpage select lines to a low logic voltage level; and a first subpage comprising a first set of cells from the plurality of cells, such that within the first set of cells, one cell in each column within the first set of columns is coupled to a first local word line, wherein the first local word line is asserted when a first global word line is asserted and a first subpage select line is asserted.

16. The DRAM array of claim 15, wherein a first subset of cells that are within the first set of cells and associated with a first column within the first set of columns are coupled to a first bit line of the pair of bit lines within the first column and a second subset of the cells that are within the first set of cells and associated with the first column are coupled to a second bit line of the pair of bit lines within the first column.

17. The DRAM array of claim 15, wherein the subpage decoder is configured to provide a variable page width operation such that, for a given one of the rows, the subpage decoder is operable to activate a portion of the row, which varies in size based on an output of the subpage decoder.

18. A dynamic random access memory (DRAM) array claim 1, comprising:

a plurality of cells arranged in a plurality of rows and a plurality of columns, each cell in the plurality of cells being associated with one column in the plurality of columns and one row in the plurality of rows;

a plurality of sense amplifiers, each sense amplifier in the plurality of sense amplifiers being associated with one column in the plurality of columns and coupled to a pair of bit lines within the one column;

a row decoder, coupled to a plurality of global word lines, wherein each global word line in the plurality of global word lines is associated with a corresponding row of the plurality of rows;

a subpage decoder, coupled to a plurality of subpage select lines, wherein each subpage select line in the plurality of subpage select lines is associated with a corresponding first set of columns of the plurality of columns and with a corresponding set of sense amplifiers of the plurality of sense amplifiers, and the subpage decoder is configured to assert the first subpage select line and a second subpage select line of the plurality of subpage select lines, based on an input column address and a subpage address, wherein a second subpage is disposed adjacent to the first subpage within the same row, and wherein the second subpage is associated with the second subpage select line; and a first subpage comprising a first set of cells from the plurality of cells, such that within the first set of cells, one cell in each column within the first set of columns is coupled to a first local word line, wherein the first local word line is asserted when a first global word line is asserted and a first subpage select line is asserted.

19. The DRAM array of claim 18, wherein a first subset of sense amplifiers of the plurality of sense amplifiers is coupled to the first subpage select line and a second subset of sense amplifiers of the plurality of sense amplifiers is coupled to a second subpage select line.

20. The DRAM array of claim 18, further comprising a second subpage comprising a second set of cells from the plurality of cells, such that within the second set of cells, one cell in each column within a second set of columns of the plurality of columns is coupled to a second local word line, wherein the second local word line is asserted when the first global word line is asserted and a second subpage select line is asserted.

* * * * *